United States Patent
Khare et al.

(10) Patent No.: US 10,199,267 B2
(45) Date of Patent: Feb. 5, 2019

(54) TUNGSTEN NITRIDE BARRIER LAYER DEPOSITION

(71) Applicant: Lam Research Corporation, Fremont, CA (US)

(72) Inventors: Rohit Khare, Fremont, CA (US); Jasmine Lin, San Jose, CA (US); Anand Chandrashekar, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/640,068

(22) Filed: Jun. 30, 2017

(65) Prior Publication Data

US 2019/0006226 A1 Jan. 3, 2019

(51) Int. Cl.
*H01L 21/768* (2006.01)
*H01L 27/108* (2006.01)

(52) U.S. Cl.
CPC .... *H01L 21/7687* (2013.01); *H01L 21/76843* (2013.01); *H01L 21/76876* (2013.01); *H01L 21/76879* (2013.01); *H01L 21/76889* (2013.01); *H01L 27/10888* (2013.01)

(58) Field of Classification Search
USPC ...................................................... 438/602
See application file for complete search history.

(56) References Cited

U.S. PATENT DOCUMENTS

| | | | |
|---|---|---|---|
| 6,206,967 B1 | 3/2001 | Mak et al. | |
| 6,551,929 B1 | 4/2003 | Kori et al. | |
| 6,607,976 B2 | 8/2003 | Chen et al. | |
| 6,635,965 B1 | 10/2003 | Lee et al. | |
| 6,720,261 B1 | 4/2004 | Anderson et al. | |
| 6,740,585 B2 | 5/2004 | Yoon et al. | |
| 6,861,356 B2 * | 3/2005 | Matsuse | H01L 21/28061 257/E21.168 |
| 6,902,763 B1 | 6/2005 | Elers et al. | |

(Continued)

FOREIGN PATENT DOCUMENTS

WO 01/29893 4/2001
WO WO 01/27347 4/2001

OTHER PUBLICATIONS

Klaus, J.W., et al. "Atomically Controlled Growth of Tungsten and Tungsten Nitride Using Sequential Surface Reactions," Applied Surface Science, 162-163, 2000, pp. 479-491.

(Continued)

*Primary Examiner* — Moazzam Hossain
*Assistant Examiner* — Lawrence C Tynes, Jr.
(74) *Attorney, Agent, or Firm* — Weaver Austin Villeneuve & Sampson LLP

(57) ABSTRACT

Provided herein are methods of tungsten nitride (WN) deposition. Also provided are stacks for tungsten (W) contacts to silicon germanium (SiGe) layers and methods for forming them. The stacks include SiGe/tungsten silicide $(WSi_x)/WN/W$ layers, with $WSi_x$ providing an ohmic contact between the SiGe and WN layers. Also provided are methods for reducing fluorine (F) attack of underlying layers in deposition of W-containing films using tungsten hexafluoride $(WF_6)$. Apparatuses to perform the methods are also provided.

20 Claims, 7 Drawing Sheets

(56) References Cited

U.S. PATENT DOCUMENTS

| | | | |
|---|---|---|---|
| 7,005,372 B2* | 2/2006 | Levy | C23C 16/0272 257/E21.171 |
| 7,262,125 B2 | 8/2007 | Wongsenakhum et al. | |
| 7,638,437 B2* | 12/2009 | Seo | C23C 16/06 257/E21.171 |
| 7,691,749 B2 | 4/2010 | Levy et al. | |
| 7,754,604 B2 | 7/2010 | Wongsenakhum et al. | |
| 7,851,355 B2* | 12/2010 | Futase | H01L 21/02063 438/637 |
| 9,553,100 B2* | 1/2017 | Kamiya | H01L 21/0206 |
| 2001/0041250 A1* | 11/2001 | Werkhoven | C23C 16/029 428/212 |
| 2002/0001899 A1* | 1/2002 | Ito | H01L 21/823857 438/231 |
| 2002/0036353 A1* | 3/2002 | Song | H01L 21/28518 257/774 |
| 2003/0020180 A1* | 1/2003 | Ahn | H01L 21/28556 257/786 |
| 2003/0104126 A1 | 6/2003 | Fang et al. | |
| 2003/0161952 A1* | 8/2003 | Wang | C23C 16/02 427/255.392 |
| 2004/0070421 A1* | 4/2004 | Kapoor | H01L 27/118 326/38 |
| 2004/0113213 A1* | 6/2004 | Maekawa | H01L 21/265 257/411 |
| 2005/0142690 A1* | 6/2005 | Lee | H01L 21/324 438/72 |
| 2005/0181555 A1* | 8/2005 | Haukka | C23C 16/029 438/232 |
| 2005/0266684 A1* | 12/2005 | Lee | H01L 21/28562 438/653 |
| 2006/0094238 A1 | 5/2006 | Levy et al. | |
| 2007/0134914 A1* | 6/2007 | Cheong | H01L 21/28562 438/627 |
| 2008/0265417 A1* | 10/2008 | Kawamura | H01L 21/28518 257/751 |
| 2008/0315254 A1* | 12/2008 | Fukuda | H01L 21/02532 257/190 |
| 2009/0053893 A1* | 2/2009 | Khandelwal | C23C 16/0281 438/680 |
| 2010/0151693 A1* | 6/2010 | Shimizu | H01L 21/28255 438/761 |
| 2011/0101447 A1* | 5/2011 | Cho | H01L 27/10885 257/329 |
| 2011/0121300 A1* | 5/2011 | Miyairi | H01L 27/1233 257/59 |
| 2012/0273872 A1* | 11/2012 | Lim | H01L 27/0688 257/329 |
| 2013/0109162 A1* | 5/2013 | Rogers | H01L 21/28273 438/513 |
| 2013/0109164 A1* | 5/2013 | Olsen | H01L 21/0217 438/585 |
| 2014/0027664 A1* | 1/2014 | Lei | C01B 35/146 252/62.3 R |
| 2015/0001610 A1* | 1/2015 | Zhang | H01L 29/792 257/324 |
| 2015/0037972 A1* | 2/2015 | Danek | C23G 5/00 438/643 |
| 2015/0270281 A1* | 9/2015 | Lee | H01L 27/11582 257/314 |
| 2017/0125548 A1* | 5/2017 | Hung | H01L 29/66545 |

OTHER PUBLICATIONS

U.S. Office Action dated Mar. 23, 2005, issued in U.S. Appl. No. 10/690,492.
U.S. Notice of Allowance dated Sep. 14, 2005, issued in U.S. Appl. No. 10/690,492.
U.S. Office Action dated Oct. 16, 2008, issued in U.S. Appl. No. 11/349,035.
U.S. Final Office Action dated Feb. 25, 2009, issued in U.S. Appl. No. 11/349,035.
U.S. Office Action dated Jun. 4, 2009, issued in U.S. Appl. No. 11/349,035.
U.S. Final Office Action dated Nov. 20, 2009, issued in U.S. Appl. No. 11/349,035.
U.S. Notice of Allowance dated Jun. 2, 2010, issued in U.S. Appl. No. 11/349,035.
U.S. Office Action dated Jun. 27, 2009, issued in U.S. Appl. No. 11/305,368.
U.S. Office Action dated Apr. 3, 2009, issued in U.S. Appl. No. 11/305,368.
U.S. Notice of Allowance dated Nov. 17, 2009, issued in U.S. Appl. No. 11/305,368.
KR Office Action dated Dec. 24, 2010, issued in Application No. 2004-0013210.

* cited by examiner

TUNGSTEN NITRIDE BARRIER LAYER DEPOSITION

BACKGROUND

Tungsten (W) film deposition using chemical vapor deposition (CVD) techniques is an integral part of semiconductor fabrication processes. For example, tungsten films may be used as low resistivity electrical connections in the form of horizontal interconnects, vias between adjacent metal layers, and contacts between a first metal layer and the devices on a silicon substrate. In an example tungsten deposition process, a titanium nitride (TiN) barrier layer is deposited on a dielectric substrate, followed by deposition of a thin nucleation layer of tungsten film. Thereafter, the remainder of the tungsten film is deposited on the nucleation layer as a bulk layer. Conventionally, the tungsten bulk layer is formed by the reduction of tungsten hexafluoride ($WF_6$) with hydrogen ($H_2$) in a CVD process.

Tungsten films may also be used in various memory applications, including in formation of contacts for dynamic random access memory (DRAM) structures.

SUMMARY

One aspect of the disclosure relates to a method of depositing a tungsten nitride (WN) barrier layer on a feature. The method includes providing a feature on a substrate. The feature may be formed in a dielectric layer and a silicon germanium (SiGe) layer and include a SiGe surface. The method involves exposing the SiGe surface to nitrogen radicals to treat the SiGe surface, depositing a tungsten (W) layer on the treated SiGe surface, and depositing a tungsten nitride (WN) layer conformal to the feature. In some embodiments, the method involves filling the feature with tungsten (W). The nitrogen radicals may be generated in an inductively-coupled plasma generated from nitrogen ($N_2$) gas.

In some embodiments, the W layer between 5 Å and 30 Å thick. All or a portion of the W layer is converted to a tungsten silicide layer during deposition of the W layer on the SiGe surface. In some embodiments, the method further involves forming a nitride layer on the SiGe surface. In some embodiments, depositing the W layer on the treated SiGe surface involves exposing the substrate to alternating pulses of tungsten hexafluoride ($WF_6$) and a reducing agent such as silane ($SiH_4$). In some embodiments, the treated SiGe surface prevents diffusion of fluorine from the $WF_6$ into SiGe underlying the treated SiGe surface.

In some embodiments, depositing the WN layer includes exposing the feature to alternating pulses of tungsten hexafluoride ($WF_6$), a reducing agent, and a nitriding agent. In some such embodiments, the reducing agent is diborane ($B_2H_6$) and the nitriding agent is ammonia ($NH_3$). In some such embodiments, the ratio of $WF_6$ to reducing agent molecules that the feature is exposed to is greater than 2:1. In some embodiments, the ratio is greater than 2.5:1.

In some embodiments, the method involves dehalogenating the WN layer. Dehalogenation may be performed by exposing the WN layer to a plasma generated from hydrogen ($H_2$) and argon (Ar).

These and other aspects are described further below with reference to the figures.

DETAILED DESCRIPTION

Figure 1:
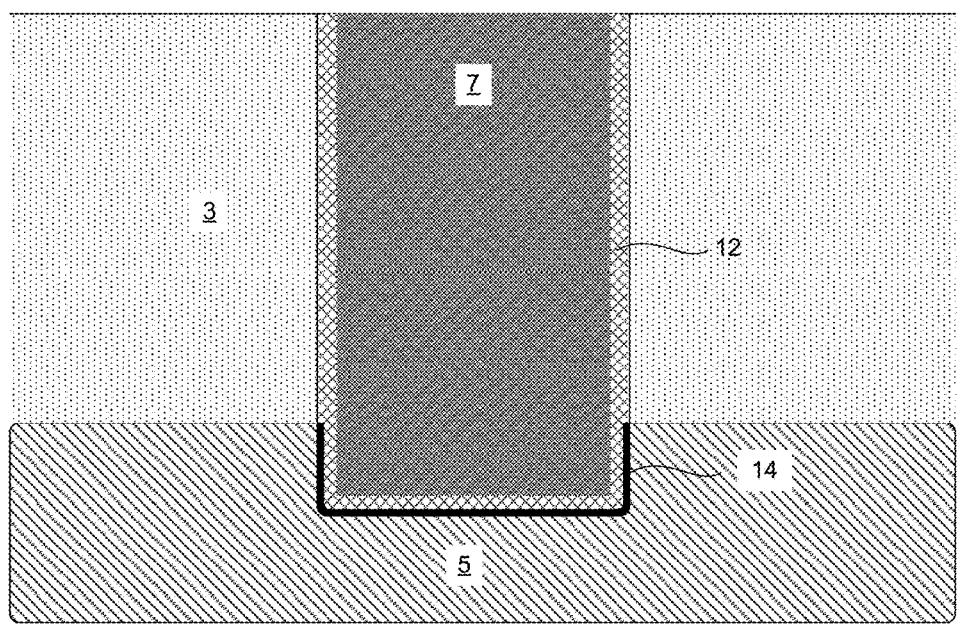
FIG. 1 is an example of a schematic depiction of a tungsten (W) contact to a silicon germanium (SiGe) layer according to certain embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor device fabrication often involves the deposition of tungsten (W) films, for example in trenches or vias to form interconnects. In a conventional methods of depositing W films, a W nucleation layer is first deposited into a via or contact. In general, a nucleation layer is a thin conformal layer that serves to facilitate the subsequent formation of a bulk material thereon. The W nucleation layer may be deposited to conformally coat the sidewalls and bottom of the feature. Conforming to the underlying feature bottom and sidewalls can be critical to support high quality deposition. Nucleation layers are often deposited using atomic layer deposition (ALD) or pulsed nucleation layer (PNL) methods.

In a PNL technique, pulses of reactant are sequentially injected and purged from the reaction chamber, typically by a pulse of a purge gas between reactants. A first reactant can be adsorbed onto the substrate, available to react with the next reactant. The process is repeated in a cyclical fashion until the desired thickness is achieved. PNL is similar to ALD techniques. PNL is generally distinguished from ALD by its higher operating pressure range (greater than 1 Torr) and its higher growth rate per cycle (greater than 1 monolayer film growth per cycle). Chamber pressure during PNL deposition may range from about 1 Torr to about 400 Torr. However, in the context of the description provided herein, PNL broadly embodies any cyclical process of sequentially adding reactants for reaction on a semiconductor substrate. Thus, the concept embodies techniques conventionally referred to as ALD. In the context of the disclosed embodiments, CVD embodies processes in which reactants are together introduced to a reactor. PNL and ALD processes are distinct from CVD processes and vice versa.

After the W nucleation layer is deposited, bulk W is typically deposited by a chemical vapor deposition (CVD) process by reducing tungsten hexafluoride ($WF_6$) using a reducing agent such as hydrogen ($H_2$). Further details of PNL and CVD processes for deposition of W-containing films are given below.

For certain tungsten metallization applications, tungsten nitride (WN) diffusion barriers may be used. One such application is DRAM metal contacts to silicon-germanium (SiGe) features. WN barriers have several advantages over barriers such as a titanium adhesion/titanium nitride barrier (Ti/TiN) bilayers. These include the ability to conformally deposit thin WN layers and the ability to deposit WN directly on dielectrics without an adhesion layer. These advantages allow more of the space available to be filled with W, lowering the overall contact resistance. Further, deposition of a WN layer can be performed at much lower temperatures than Ti/TiN, making it advantageous for low thermal budget applications.

Provided herein are methods of WN deposition. Also provided are stacks for W contacts to SiGe layers and methods for forming them. The stacks include SiGe/tungsten silicide ($WSi_x$)/WN/W layers, with $WSi_x$ providing an ohmic contact between the SiGe and WN layers. $WSi_x$ refers to any tungsten silicide, with x any appropriate integer or non-integer greater than 0. Germanium (Ge) may be present in the $WSi_x$ layer. The silicide may be formed during deposition of a tungsten flash layer, obviating the need for a high temperature anneal, making the process advantageous for low thermal budget applications. Also provided are methods for reducing F attack of underlying layers in deposition of W-containing films using $WF_6$. Apparatuses to perform the methods are also provided.

While the description below focuses on WN deposition as a diffusion barrier for W contacts to SiGe features, the methods may be used in other contexts. For example, the methods may be used to form WN layers on any surface that is susceptible to fluorine (F) or other halogen attack. Similarly, while the description below focuses on the use of the fluorine-containing $WF_6$ as the tungsten-containing precursor, the methods may also be used to protect against halogen diffusion from other halogenated tungsten-containing precursors such as tungsten hexachloride ($WCl_6$) or tungsten pentachloride ($WCl_5$).

FIG. 1 is an example of a schematic depiction of a W contact 7 to a SiGe layer 5 according to certain embodiments. The SiGe layer 5 may be, for example, part of a capacitor in a DRAM architecture. The W contact 7 is formed in a dielectric layer 3. Examples of dielectric layers include silicon oxides. In some embodiments, the dielectric layer 3 is a silicon dioxide layer formed from tetraethyl orthosilicate (TEOS). Such layers may be referred to as TEOS oxide layers. A WN barrier layer 12 is disposed between the W contact 7 and the dielectric layer 3. A tungsten silicide ($WSi_x$) layer 14 provides an ohmic contact between the SiGe layer 5 and the WN barrier layer 12. In some embodiments, the presence of an ohmic contact between SiGe and WN is important for the operation of the W contact. However, to form the $WSi_x$ layer 14 and the WN layer 12, $WF_6$ may be used as the tungsten precursor. F species from the $WF_6$ can diffuse into one or more underlying layers and attack the SiGe layer 5.

According to various embodiments, the methods described herein may include one or more of the following aspects: 1) deposition of a W flash layer prior to deposition of a WN barrier layer; 2) treatment of a SiGe layer prior to deposition of a W-containing layer; 3) high $WF_6$:reducing agent ratio during W flash layer and WN layer deposition to reduce fluorine incorporation into a film stack; and 4) dehalogenation of WN layer previously deposited. Example embodiments of each of these aspects are discussed with reference to FIGS. 2 and 3A-3D, with further details of each aspect then discussed.

Figure 2:
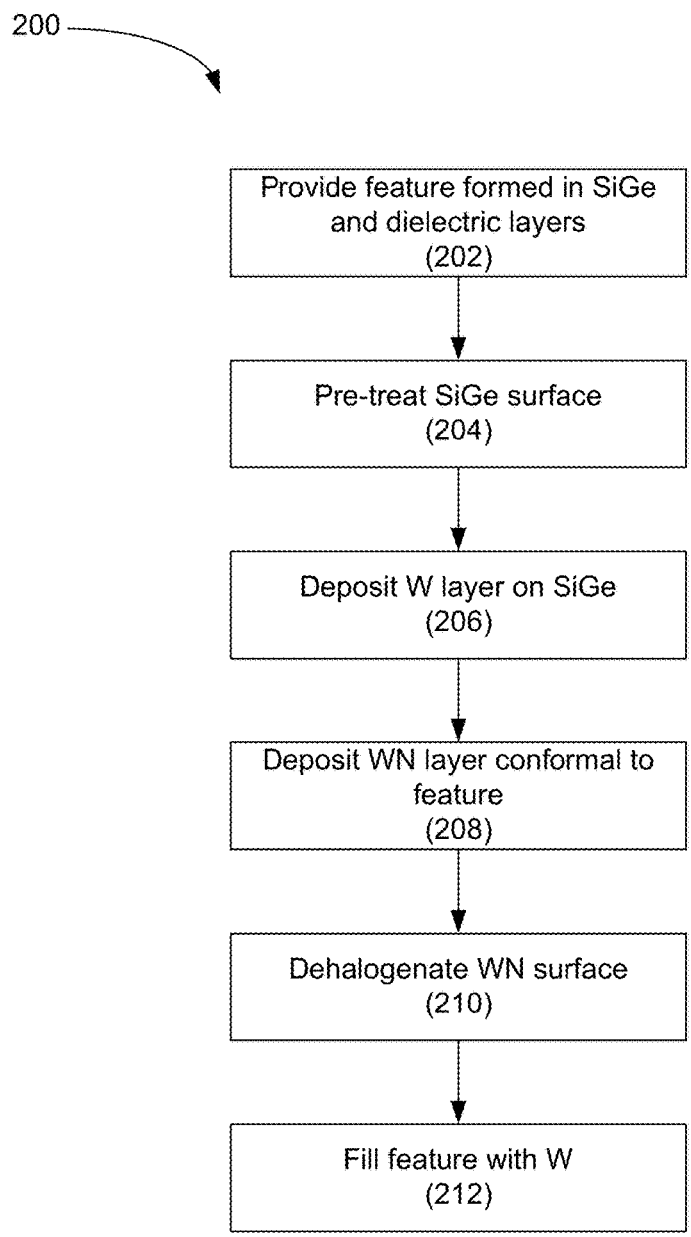
FIG. 2 is a flow diagram including operations in a method of forming a W contact to a SiGe layer according to certain embodiments.

FIG. 2 describes a method of forming a W contact to a SiGe layer that may include each of these aspects. However, it will be appreciated that certain embodiments may be implemented that include only one aspect or any combination of two or more aspects. FIGS. 3A-3D illustrate examples of schematic depiction of certain operations in the method 200.

FIG. 2 illustrates operations in a method 200 of forming a W contact to a SiGe layer according to certain embodiments. The method begins by providing a feature formed in SiGe and dielectric layers (202). The feature can be a contact hole form by a previous patterning operation, for example. At the bottom of the feature is an exposed SiGe surface, with at least some of the sidewalls of the feature having exposed silicon oxide or other dielectric surfaces. Examples of dielectric surfaces include oxide surfaces, nitride surfaces, and carbide surfaces. In some embodiments, the feature may be characterized by having a high aspect ratio and/or a narrow opening. The aspect ratio of the feature is the ratio of the depth to the opening dimension. In some embodiments, the aspect ratio of the feature may be 6:1, 10:1, 15:1 or greater. Example openings may range from 80 nm to 200 nm.

Figure 3A:
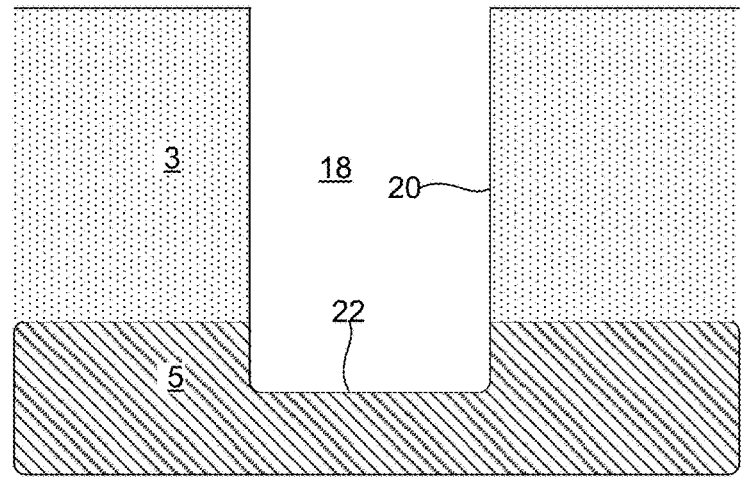
FIGS. 3A-3D illustrate examples of schematic depiction of certain operations in the method described with reference to FIG. 2.

FIG. 3A shows an example of a feature 18 formed in a SiGe layer 5 and a dielectric layer 3. The feature includes a sidewall surface 20 and a bottom surface 22. The sidewall surface 20 includes an exposed surface of the dielectric layer 2 and, toward the bottom of the feature 18, an exposed surface of the SiGe layer 5. According to various embodiments, the sidewall surface may or may not include an exposed surface of the SiGe layer 5.

Returning to FIG. 2, the method 200 proceeds by pre-treating the exposed SiGe surface. (204). According to various embodiments, a pre-treatment involves nitridation of the exposed SiGe surface. This can involve exposing the exposed SiGe surface to a nitrogen-containing plasma. Such a plasma may be generated from molecular nitrogen ($N_2$) gas. Example plasma exposure times range from 10 s to 120 s. In some embodiments, a very thin nitride layer, e.g., a silicon nitride layer, is formed by nitridation of the SiGe layer. This nitride layer acts a transient barrier to fluorine diffusion into the SiGe layer that may otherwise occur during subsequent operations. Alternatives to $N_2$ can include other nitrogen-containing gases such as ammonia ($NH_3$) or hydrazine ($N_2H_2$). In some embodiments, the plasma is generated from a $N_2/H_2$ gas. An inductively-coupled plasma (ICP) may be used in some embodiments. The plasma may be generated remotely from the substrate such that the substrate is downstream of the plasma generation. In some embodiments, the substrate is exposed to a plasma having relatively high radical content with little or no ionic species. The SiGe surface may be saturated with nitrogen radicals to react with the SiGe and form a nitride.

Next, a W layer is deposited on the treated SiGe layer. (206). This layer may referred to as a W flash layer. The W flash layer may be deposited by exposing the substrate to $WF_6$ and a reducing agent. In some embodiments, a silane such as $SiH_4$, is used as the reducing agent. The W flash layer thickness may be limited to avoid interfering with subsequent WN deposition and to prevent or minimize deposition on the dielectric surfaces. Temperature during flash layer deposition may range from 200° C. to 300° C., with all or a portion of the W flash layer is converted to a tungsten silicide layer during deposition. Example thicknesses (including the silicide portion) of the W flash layer range from 5 Å to 30 Å. Because the silicide is formed during deposition, in some embodiments, the process may proceed without a subsequent thermal anneal to form the silicide.

Figure 3B:
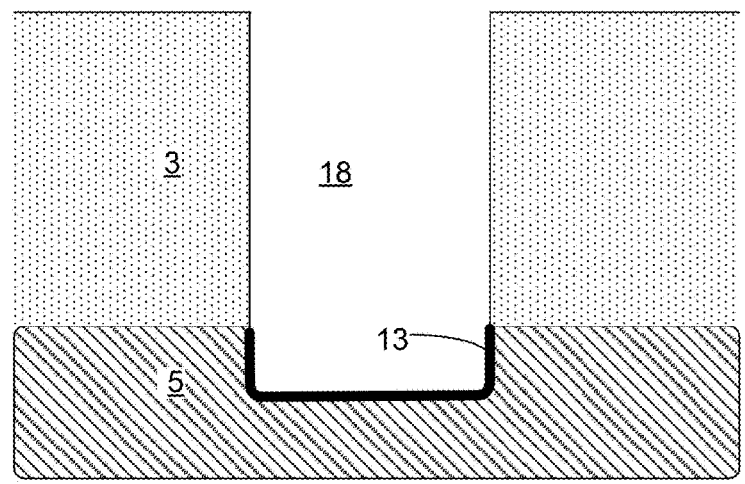

FIG. 3B shows an example of the feature 18 including a W flash layer 13 on the exposed part of the SiGe layer 5. A thin nitride layer (not shown) is at an interface between the SiGe surface 5 and the W flash layer 13 and protects the SiGe layer 5 from fluorine radicals generated during deposition of the W flash layer and that would otherwise diffuse into the SiGe layer 5.

The method 200 proceeds by depositing a WN layer that is conformal to the feature. (208). Depositing the WN layer may be performed by exposing the feature to sequential pulses $WF_6$, a reducing agent, and a nitriding agent in a thermal (non-plasma) PNL or ALD process. In certain embodiments, diborane ($B_2H_6$) is used as the reducing agent and ammonia ($NH_3$) is the nitriding agent. Boron-containing reducing agents such as $B_2H_6$ may be used rather than silicon-containing reducing agents such as silane ($SiH_4$) as the latter can result in significantly long nucleation delay for WN deposition.

Figure 3C:
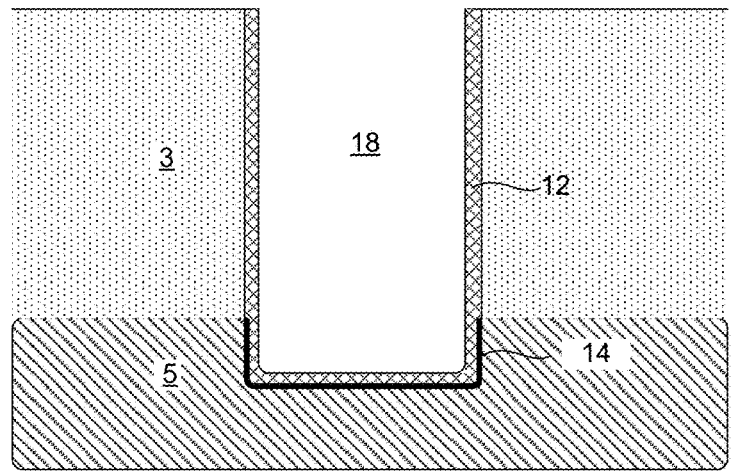

In certain embodiments in which deposition of the WN layer involves $WF_6$ and $B_2H_6$ pulses, the ratio of $WF_6$:$B_2H_6$ is at least 2.9:1. High $WF_6$:$B_2H_6$ ratio reduces the fluorine attack. Example substrate temperature ranges for deposition include 250° C. to 400° C., e.g., 250° C. to 350° C. In some embodiments, a relatively low temperature is used to improve step coverage. For example, lowering the temperature from 325° C. to 300° C. increased step coverage from 69% to 89%. The thickness of the WN layer may vary; in some embodiments, it is between 80 Å to 100 Å. FIG. 3C shows an example of the feature 18 including a WN barrier layer 12 conformal to feature 7. The WN layer is typically at least twice as thick and can be at least twenty times as thick as the W flash layer, with example thicknesses being from 70 Å to 100 Å.

The method 200 proceeds by dehalogenating the WN surface (210). The WN deposition process can leave residual fluorine impurities in the film, which can diffuse into the underlying layer and attack the SiGe layer. Dehalogenating the surface can involve exposing the surface to a plasma generated from a hydrogen-containing gas such as $H_2$. In some embodiments, the plasma is generated from an Ar/$H_2$ mixture or a $N_2$/$H_2$ mixture. H radicals in the plasma react with fluorine impurities to form HF gas, which can be exhausted from the processing chamber.

Figure 3D:
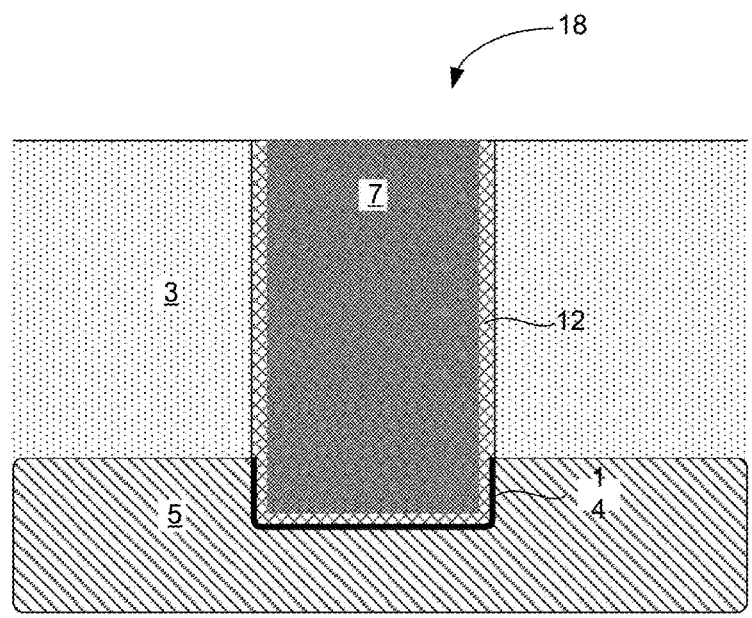

The feature is then filled with W. (212). Feature fill may involve a CVD deposition of a W bulk layer using a W-containing precursor and a reducing agent. For example, $WF_6$ and $H_2$ may be used. FIG. 3D shows an example of the feature 18, now filled with tungsten to form a W contact 7.

As indicated above, the methods described herein may include any one or more of the following aspects: 1) deposition of a W flash layer prior to deposition of a WN barrier layer; 2) treatment of a SiGe layer prior to deposition of a tungsten-containing layer using a halogen-containing chemistry; 3) high $WF_6$:reducing agent ratio during WN layer deposition to reduce fluorine incorporation; and 4) dehalogenation of WN layer. Further details of each are provided below:

Deposition of a W Flash Layer:

A W flash layer is provided on a SiGe or other surface prior to deposition of a WN barrier layer. The W flash layer may react with the SiGe layer to form a binary or ternary compound and provide an ohmic contact between the WN barrier and SiGe layer or other underlying layer. In some embodiments, a tungsten silicide layer is formed.

A thickness of the W flash layer may be limited to about 5 Å to 30 Å in some embodiments. On blanket film stacks, a thinner W flash layer results in lower resistivity. If the W flash layer is too thick, it can result in discontinuous WN growth at the bottom sidewall of high aspect ratio features. This may be an effect of the flash layer deposition. In one example, a 16 Å W flash layer deposited in a 17:1 aspect ratio, 90 nm opening feature resulted in continuous WN deposition, while a W flash layer of about 32 Å thick deposited in a feature of the same size resulted in discontinuous WN deposition. Further, by limiting the number of deposition cycles and the W flash layer thickness, deposition on the dielectric surfaces in the feature can be prevented or limited. In some embodiments, a W flash layer between 5 Å to 30 Å results in acceptably low resistivity and continuous WN growth.

To maintain tight control over the thickness of the W flash layer, a surface-mediated process such as a PNL or ALD process used. Pulses of a tungsten-containing precursor and a reducing agent are introduced sequentially into a chamber that houses the substrate. In some embodiments, a silane is used as the reducing agent rather than a borane. It has been found that W flash layers deposited on SiGe layers using $SiH_4$ results in a lower resistivity contact than W flash layers deposited using $B_2H_6$ as the reducing agent.

Figure 4:
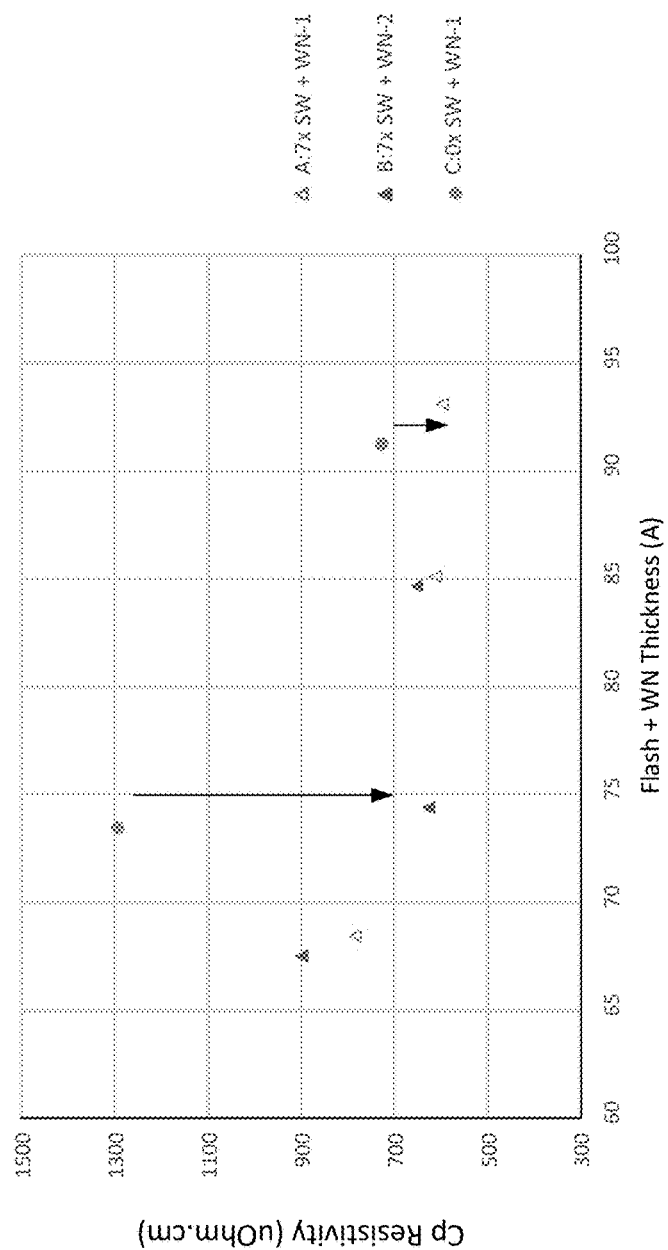
FIG. 4 shows resistivity at various thicknesses for three blanket films stacks according to certain embodiments deposited on 2 k A SiGe.

FIG. 4 shows resistivity at various thicknesses for three blanket films stacks deposited on 2 k Å SiGe. Stack A includes a W flash layer deposited using seven cycles of $WF_6$/$SiH_4$ and WN layer deposited using $WF_6$/$B_2H_6$/$NH_3$ cycles. Stack B includes a W flash layer deposited using seven cycles of $WF_6$/$SiH_4$ and WN layer deposited using $WF_6$/$B_2H_6$/$NH_3$ cycles. Process conditions for the WN layers in the A and B processes were different. Stack C does not include a W flash layer, having only a WN layer deposited using the same process as used to deposit the WN layer of stack A.

The arrows indicate a comparison the film stacks including the flash layers with the film stack without the flash layers at 70 Å and 90 Å. At 70 Å, the W flash layer results in a resistivity reduction of about 40%; and at 90 Å, it results in a reduction of about 15%.

Treatment of a SiGe Layer Prior to Deposition of a Tungsten-Containing Layer:

By exposing the SiGe layer to a nitrogen-containing gas, such as $N_2$, a very thin nitride layer can be formed. Other nitrogen-containing gases such as $NH_3$ or $N_2H_2$ may be used. Oxygen-containing gases may be avoided as can lead to the formation of oxides such as silicon oxides. While oxides can also protect the SiGe layer from fluorine diffusion, they can lead to higher resistivity films.

The nitrogen pre-treatment may also prevent oxygen penetration. Oxygen from the environment may attack the SiGe and cause higher resistivity. For example, fluorine may etch a SiGe layer, allowing W penetration. The W may then be oxidized by oxygen (O) that has penetrated the SiGe layer, causing higher resistivity.

Table 1 shows comparative results for each of the following three processes:
Process 1—no pre-treatment, no-W flash layer, and a WN layer
Process 2—no pre-treatment, WF6/$SiH_4$-deposited W flash layer, and a WN layer; and
Process 3—$N_2$ plasma pre-treatment, WF6/$SiH_4$-deposited W flash layer, and a WN layer.

SiGe attack was observed from TEM images and electron energy loss spectroscopy (EELS) and secondary ion mass spectrometry (SIMS) were used to analyze F and O concentration in the underlying SiGe layer.

TABLE 1

Resistivity and Impurity Results for Various Process Sequences

| | Process Sequence | | | Metrology | | |
|---|---|---|---|---|---|---|
| Process | $N_2$ plasma | $WF_6/SiH_4$ flash layer | WN | Resistivity ($\mu\Omega$-cm) | TEM | EELS/ SIMS |
| 1 | No | No | Yes | 987 | Attack at SiGe surface | F and O observed in SiGe |
| 2 | No | Yes | Yes | 603 | Attack at SiGe surface | F and O observed in SiGe |
| 3 | Yes | Yes | Yes | 319 | Clean, smooth interface | No significant O or F in SiGe |

The results in Table 1 show that the pre-treatment is critical to low resistivity and low impurities.

High $WF_6$:Reducing Agent Ratio During Deposition of W Flash Layer and WN:

By using a high $WF_6$:reducing agent ratio (in terms of total molecules reaching wafer surface) in the WN barrier layer deposition process, SiGe attack can be reduced. The mechanism by which this occurs is by reducing the number of sites on the surface on which the reducing agent adsorbs, thereby reducing the number of sites where $WF_6$ will react. Thus, although there is more fluorine species in the deposition chamber, fewer will react near the surface. In some embodiments, the reducing agent may be diluted with an inert gas.

Table 2 shows SiGe attack results of various $WF_6$:$B_2H_6$ ratios in deposition of WN in a feature form in a SiGe layer.

TABLE 2

SiGe attack observations for various $WF_6$:$B_2H_6$ ratios in deposition of WN

| $WF_6$:$B_2H_6$ ratio | SiGe attack observed in TEM image |
|---|---|
| 4.3:1 | No |
| 2.9:1 | No |
| 1.4:1 | Yes |
| 1:1 | Yes |

The integrity of the SiGe layers was determined from transmission electron microscope (TEM) images. $WF_6$:$B_2H_6$ ratios of greater than 2:1 may be used to reduce or prevent SiGe attack. In some embodiments, the $WF_6$:$B_2H_6$ ratio is greater than 2.5:1 or greater than 3:1.

$WF_6$:$B_2H_6$ ratio refers to the ratio of molecules that the substrate is exposed to are available to react. It may be calculated from:

$$\frac{WF_6 \text{ flow rate} \times (WF_6 \text{ line charge time} + WF_6 \text{ dose time})}{B_2H_6 \text{ flow rate} \times (B_2H_6 \text{ line charge time} + B_2H_6 \text{ dose time})}$$

Line charges are pressurized distributions and are discussed further below with reference to FIG. 6. Dose time refers to the amount of time the dose (also referred to a pulse) lasts. While the above values are given for $WF_6$ reduced by $B_2H_6$, a similar effect is observed for $SiH_4$ reduction of $WF_6$. Accordingly, a $WF_6$:$SiH_4$ ratios of greater than 2:1, greater than 2.5:1, or greater than 3:1.

Appropriate ratios may also be calculated for other halogenated W-containing precursors and/or other reducing agents, taking into account the reaction stoichiometries.

Dehalogenation of the WN Surface:

This involves H radicals that react with diffused halogens to form compounds (e.g., HF) that are evolved. In some embodiments, a plasma is generated from $H_2$ and an inert gas such as argon (Ar). Ar bombardment of the surface may facilitate dehalogenation by desorbing halogens that are adsorbed on the WN surface. The plasma strength may be tuned to the amount of fluorine impurities. For some processes, a mild plasma with no applied bias on the substrate is effective to remove fluorine. In some embodiments, a more aggressive process including an applied substrate bias may be used if there is a significant amount of fluorine. In some embodiments, a remote ICP plasma source is used to generated the plasma.

The methods disclosed herein involve PNL and CVD processes for deposition of thin layers and feature fill. Further details of deposition of tungsten-containing films are given below. In some implementations, the methods described herein involve deposition of a tungsten nucleation layer prior to deposition of a bulk layer. As indicated above, nucleation layer is typically a thin conformal layer that facilitates subsequent deposition of bulk tungsten-containing material thereon. According to various implementations, a nucleation layer may be deposited prior to any fill of the feature and/or at subsequent points during fill of the feature.

In certain implementations, the nucleation layer and other layers are deposited using PNL techniques. In a PNL technique, pulses of a reducing agent, optional purge gases, and tungsten-containing precursor are sequentially injected into and purged from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques. PNL techniques for depositing tungsten nucleation layers are described in U.S. Pat. Nos. 6,635,965; 7,005,372; 7,141,494; 7,589,017, 7,772,114, 7,955,972 and 8,058,170, and U.S. Patent Publication No. 2010-0267235, all of which are incorporated by reference herein in their entireties. Nucleation layer thickness can depend on the nucleation layer deposition method as well as the desired quality of bulk deposition. In general, nucleation layer thickness is sufficient to support high quality, uniform bulk deposition. Examples may range from 10 Å-100 Å.

In certain implementations, bulk tungsten may be deposited directly in a feature without use of a nucleation layer. For example, in some implementations, the feature surface and/or an already-deposited under-layer supports bulk tungsten deposition. In some implementations, a bulk tungsten deposition process that does not use a nucleation layer may be performed. U.S. patent application Ser. No. 13/560,688, filed Jul. 27, 2012, incorporated by reference herein, describes deposition of a tungsten bulk layer without a nucleation layer, for example.

In various implementations, tungsten nucleation layer deposition can involve exposure to a tungsten-containing precursor such as tungsten hexafluoride ($WF_6$) or tungsten hexachloride ($WCl_6$).

Examples of reducing agents can include boron-containing reducing agents including diborane ($B_2H_6$) and other boranes, silicon-containing reducing agents including silane (SiH$_4$) and other silanes, hydrazines, and germanes. In some implementations, pulses of tungsten-containing precursors can be alternated with pulses of one or more reducing agents, e.g., S/W/S/W/B/W, etc., W represents a tungsten-containing precursor, S represents a silicon-containing precursor, and B represents a boron-containing precursor.

According to various implementations, hydrogen may or may not be run in the background. Further, in some implementations, deposition of a tungsten nucleation layer may be followed by one or more treatment operations prior to tungsten bulk deposition. Treating a deposited tungsten nucleation layer to lower resistivity is described for example in U.S. Pat. Nos. 7,772,114 and 8,058,170 and U.S. Patent Publication No. 2010-0267235, incorporated by reference herein.

Deposition of the WN layers described herein may also be performed by PNL. Such processes include pulses of the tungsten-containing precursor, a reducing agent, and a nitriding agent. Examples, of suitable nitriding agents include NH$_3$ and N$_2$H$_4$.

In many implementations, tungsten bulk deposition can occur by a CVD process in which a reducing agent and a tungsten-containing precursor are flowed into a deposition chamber to deposit a bulk fill layer in the feature. An inert carrier gas may be used to deliver one or more of the reactant streams, which may or may not be pre-mixed. Unlike PNL or ALD processes, this operation generally involves flowing the reactants continuously until the desired amount is deposited. In certain implementations, the CVD operation may take place in multiple stages, with multiple periods of continuous and simultaneous flow of reactants separated by periods of one or more reactant flows diverted.

Various tungsten-containing gases including, but not limited to, WF$_6$, WCl$_6$, and W(CO)$_6$ can be used as the tungsten-containing precursor. In certain implementations, the tungsten-containing precursor is a halogen-containing compound, such as WF$_6$. In certain implementations, the reducing agent is hydrogen gas, though other reducing agents may be used including silane (SiH$_4$), disilane (Si$_2$H$_6$) hydrazine (N$_2$H$_4$), diborane (B$_2$H$_6$) and germane (GeH$_4$). In many implementations, hydrogen gas is used as the reducing agent in the CVD process. In some other implementations, a tungsten precursor that can decompose to form a bulk tungsten layer can be used. Bulk deposition may also occur using other types of processes including ALD processes.

Examples of temperatures may range from 200° C. to 500° C. According to various implementations, any of the CVD W operations described herein can employ a low temperature CVD W fill, e.g., at about 250° C.-350° C. or about 300° C.

Deposition may proceed according to various implementations until a certain feature profile is achieved and/or a certain amount of tungsten is deposited. In some implementations, the deposition time and other relevant parameters may be determined by modeling and/or trial and error. In some implementations, a process chamber may be equipped with various sensors to perform in-situ metrology measurements for end-point detection of a deposition operation. Examples of in-situ metrology include optical microscopy and X-Ray Fluorescence (XRF) for determining thickness of deposited films.

It should be understood that the tungsten films described herein may include some amount of other compounds, dopants and/or impurities such as nitrogen, carbon, oxygen, boron, phosphorous, sulfur, silicon, germanium and the like, depending on the particular precursors and processes used. The tungsten content in the film may range from 20% to 100% (atomic) tungsten. In many implementations, the films are tungsten-rich, having at least 50% (atomic) tungsten, or even at least about 60%, 75%, 90%, or 99% (atomic) tungsten. In some implementations, the films may be a mixture of metallic or elemental tungsten (W) and other tungsten-containing compounds such as tungsten carbide (WC), tungsten nitride (WN), etc.

Distribution of a material within a feature may be characterized by its step coverage. Step coverage is ratio of two thicknesses, the thickness of the material inside the feature divided by the thickness of the material near the opening. For feature fill, high step coverage can desirable.

Apparatus

Any suitable chamber may be used to implement the disclosed embodiments. Example deposition apparatuses include various systems, e.g., ALTUS® and ALTUS® Max, available from Lam Research Corp., of Fremont, Calif., or any of a variety of other commercially available processing systems. The process can be performed on multiple deposition stations in parallel.

Figure 5:
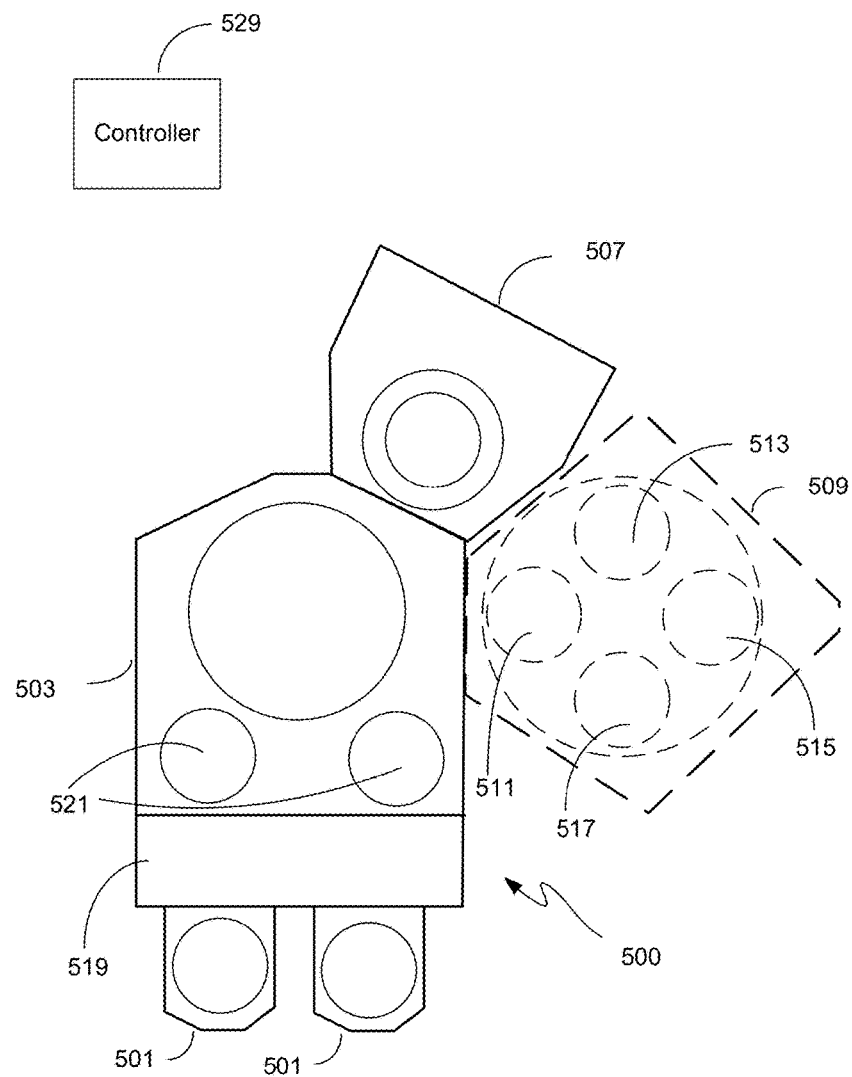
FIG. 5 is a block diagram of a processing system suitable for conducting deposition processes in accordance with embodiments.

FIG. 5 is a block diagram of a processing system suitable for conducting deposition processes in accordance with embodiments of the invention. The system 500 includes a transfer module 503. The transfer module 503 provides a clean, pressurized environment to minimize the risk of contamination of substrates being processed as they are moved between the various reactor modules. Mounted on the transfer module 503 is a multi-station reactor 509 capable of performing PNL deposition, as well as CVD deposition according to embodiments of the invention. Chamber 509 may include multiple stations 511, 513, 515, and 517 that may sequentially perform these operations. For example, chamber 509 could be configured such that stations 511 and 513 perform PNL deposition of a W flash layer and WN layer, and stations 513 and 515 perform CVD. Each deposition station may include a heated wafer pedestal and a showerhead, dispersion plate or other gas inlet.

Also mounted on the transfer module 503 may be one or more single or multi-station modules 507 capable of performing plasma or chemical (non-plasma) pre-cleans. In the embodiments described herein the one or modules 507 may be used to perform the plasma pre-treatment and plasma post-treatments described above.

The system 500 also includes one or more (in this case two) wafer source modules 501 where wafers are stored before and after processing. An atmospheric robot (not shown) in the atmospheric transfer chamber 519 first removes wafers from the source modules 501 to loadlocks 521. A wafer transfer device (generally a robot arm unit) in the transfer module 503 moves the wafers from loadlocks 521 to and among the modules mounted on the transfer module 403.

In certain embodiments, a system controller 529 is employed to control process conditions during deposition. The controller will typically include one or more memory devices and one or more processors. The processor may include a CPU or computer, analog and/or digital input/output connections, stepper motor controller boards, etc.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller may control all of the activities of the deposition apparatus. The system controller executes system control software including sets of instructions for controlling the timing, mixture of gases, chamber pressure, chamber temperature, wafer temperature, radio frequency (RF) power levels if used, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language. Alternatively, the control logic may be hard coded in the controller. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions. The foregoing describes implementation of embodiments of the invention in a single or multi-chamber semiconductor processing tool.

Figure 6:
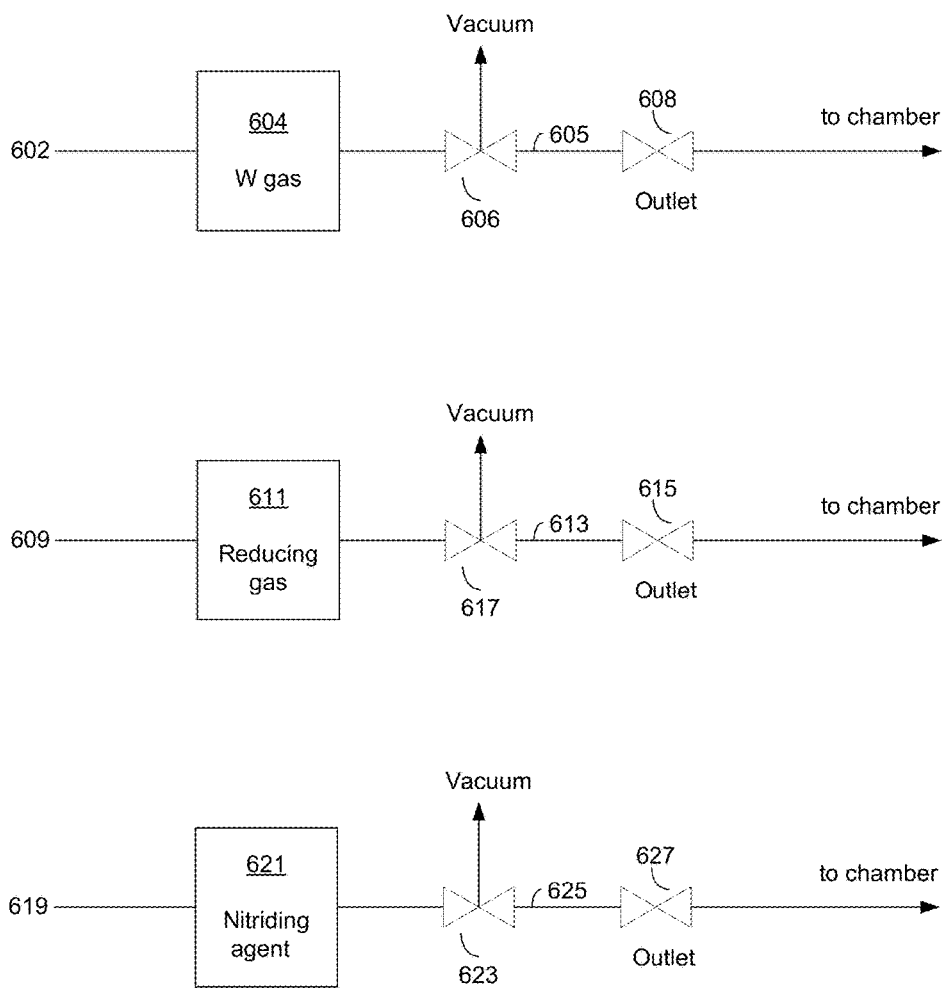
FIG. 6 is a schematic diagram showing basic features of a manifold system that may be used in accordance with certain embodiments.

The apparatus may include a gas manifold system, which provides line charges to the various gas distribution lines as shown schematically in FIG. 6. Manifold 604 has an input 602 from a source of a tungsten-containing precursor gas (not shown), manifold 611 has an input 609 from a source of silane, diborane or other reducing gas (not shown) and manifold 621 has an input 619 from a source of nitriding agent (not shown). The manifolds 604, 611 and 621 provide the tungsten-containing precursor gas, reducing gas and nitriding agent to the deposition chamber through valved distribution lines, 605, 613 and 625 respectively. The various valves are opened or closed to provide a line charge, i.e., to pressurize the distribution lines. For example, to pressurize distribution line 605, valve 606 is closed to vacuum and valve 608 is closed. After a suitable increment of time, valve 608 is opened and the tungsten-containing precursor gas is delivered to the chamber. After a suitable time for delivery of the gas, valve 608 is closed. The chamber can then be purged to a vacuum by opening of valve 606 to vacuum.

Similar processes are used to deliver the reducing gas and the nitriding agent. To introduce the reducing gas, for example, distribution line 613 is charged by closing valve 615 and closing valve 617 to vacuum. Opening of valve 615 allows for delivery of the reducing gas to the chamber. Similarly, to introduce the nitriding agent, distribution line 625 is charged by closing valve 627 and closing valve 623 to vacuum. Opening of valve 627 allows for delivery of the ammonia or other nitriding agent to the chamber. The amount of time allowed for line charges changes the amount and timing of the initial delivery of the gas. Some examples of suitable line charge times are presented below.

FIG. 6 also shows vacuum pumps in which valves 606, 617 and 623, respectively, can be opened to purge the system. The supply of gas through the various distribution lines is controlled by a controller, such as a mass flow controller which is controlled by a microprocessor, a digital signal processor or the like, that is programmed with the flow rates, duration of the flow, and the sequencing of the processes.

If the process employs both a boron-containing reducing agent and a silane reducing agent, there may be two subsystems for the reducing agent: one for the boron-containing reducing agent and another for the silane.

Note that the PNL processes described above may require precise timing of valves and mass flow controllers (MFCs) supplying pulses of reagent to the semiconductor substrate during PNL-W or PNL-WN deposition. In one way to make this possible, valve and MFC commands are delivered to embedded digital input-output controllers (IOC) in discrete packets of information containing instructions for all time-critical commands for all or a part of a PNL deposition sequence. The ALTUS systems of Lam Research provide at least one IOC sequence. The IOCs can be physically located at various points in the apparatus; e.g., within the process module or on a stand-alone power rack standing some distance away from the process module. There are typically multiple IOCs in each module (e.g., 3 per module). With respect to the actual instructions included in a sequence, all commands for controlling valves and setting flow for MFCs (for all carrier and reactant gases) may be included in a single IOC sequence. This assures that the timing of all the devices is tightly controlled from an absolute standpoint and also relative to each other. There are typically multiple IOC sequences running at any given time. This allows for, say, PNL to run at stations 1-2 with all timing controlled for all the hardware components needed to deposit PNL-WN at those stations. A second sequence might be running concurrently to deposit CVD-W at other deposition stations in the same module. The relative timing of the devices controlling the delivery of reagents to stations 3-4 is important within that group of devices, but the relative timing of the PNL process at stations 1-2 can be offset from the relative timing of CVD at stations 3-4. An IOC translates the information in a packetized sequence and delivers digital or analog command signals directly to MFC or pneumatic solenoid banks controlling the valves.

In one example, to achieve good response and repeatability, the nitriding agent flow may be introduced by first enabling flow through a nitriding agent Mass Flow Controller (MFC) and diverting the flow to a process vacuum pump to stabilize flow before introducing the agent into the deposition chamber. To stabilize the nitriding agent flow, the outlet valve 627 is closed while divert valve 623 is open. The manifold system then pressurizes delivery line 65 to assure a controlled initial burst of nitriding agent by closing the divert valve 623 with the process outlet valve 627 closed for between about 0.10 and 3 seconds. Next, the system opens the outlet valve 627 to the deposition chamber with the divert valve closed to deliver nitriding agent to the process chamber during deposition. Valve timing can be controlled using an embedded input-output controller command sequence as described above. The above process may be applied to deposition of tungsten-containing nucleation layers and bulk layers using PNL or CVD.

One manifold system sequence for delivering a boron-containing gas (e.g., diborane) to the chamber involves the following operations. First, the system divert a diborane-carrier gas mixture to a vacuum pump for a period of time while the MFC or other flow controlling device stabilizes. In one example, this is done for between about 0.5 and 5 seconds using a mixture of 5% by volume diborane in a nitrogen carrier gas. Next the system pressurizes the diborane delivery manifold by closing both the divert valve and the outlet to the deposition chamber. In one implementation, this is done for a period of time between about 0.1 to 5 seconds. This creates an initial burst of reagent when the outlet to the deposition chamber is opened. In one implementation, the outlet valve is opened for a period of between about 0.1 to 10 seconds. This is then followed by purging diborane from the chamber using a suitable carrier gas.

A pulse of tungsten-containing gas may be generated as follows. Initially, the system diverts $WF_6$ to a vacuum pump for a period of time while the MFC or other flow-controlling device stabilizes. This may be done for a period of between about 0.5 to 5 seconds in one example. Next, the system pressurizes the tungsten gas delivery manifold by closing both the divert outlet 606 and the outlet 608 to the deposition chamber. This may be done for a period of between about 0.1 and 5 seconds, for example, to create an initial burst of reagent when the outlet to the deposition chamber is opened. This is accomplished by opening outlet valve 308 for between about 0.1 and 10 seconds in one example. Thereafter, the tungsten-containing gas is purged from the deposition chamber using a suitable purge gas.

The pulsed flow of silane or other reducing gas may be implemented in a similar manner by controlling divert valve 617 and outlet valve 615. The divert, line pressurization, and flow steps may be timed as presented above for the tungsten-containing gas example. After pulsing with reducing gas for a period of between about 0.1 and 10 seconds, outlet valve 615 is closed and a purge gas is flowed through the chamber.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed:

1. A method comprising:
    providing a feature formed in a dielectric layer and a silicon germanium (SiGe) layer on a substrate, wherein the feature comprises a SiGe surface;
    exposing the SiGe surface to nitrogen radicals to treat the SiGe surface;
    depositing a tungsten (W) layer on the treated SiGe surface; and
    depositing a tungsten nitride (WN) layer conformal to the feature.

2. The method of claim 1, further comprising filling the feature with tungsten (W).

3. The method of claim 1, wherein nitrogen radicals are generated in an inductively-coupled plasma generated from nitrogen ($N_2$) gas.

4. The method of claim 1, further comprising forming a nitride layer on the SiGe surface.

5. The method of claim 1, wherein depositing the W layer on the treated SiGe surface comprises exposing the substrate to alternating pulses of tungsten hexafluoride ($WF_6$) and a reducing agent.

6. The method of claim 5, wherein the reducing agent is silane ($SiH_4$).

7. The method of claim 5, wherein the treated SiGe surface prevents diffusion of fluorine from the $WF_6$ into SiGe underlying the treated SiGe surface.

8. The method of claim 1, wherein the W layer is between 5 Å and 30 Å thick.

9. The method of claim 1, wherein depositing WN layer comprises exposing the feature to alternating pulses of tungsten hexafluoride ($WF_6$), a reducing agent, and a nitriding agent.

10. The method of claim 9, wherein the reducing agent is diborane ($B_2H_6$) and the nitriding agent is ammonia ($NH_3$).

11. The method of claim 9, wherein the ratio of $WF_6$ to reducing agent molecules that the feature is exposed to is greater than 2:1.

12. The method of claim 11, wherein the ratio is greater than 2.5:1.

13. The method of claim 1, wherein all or a portion of the W layer is converted to a tungsten silicide layer during deposition of the W layer on the SiGe surface.

14. The method of claim 1, wherein the WN layer includes halogen impurities.

15. The method of 14, further comprising dehalogenating the WN layer.

16. The method of claim 15, wherein dehalogenating the WN layer comprises exposing it to a plasma generated from hydrogen ($H_2$) and an inert gas.

17. The method of claim 1, further comprising exposing the WN layer to a plasma generated from hydrogen ($H_2$).

18. The method of claim 1, further comprising exposing the WN layer to a plasma generated from an inert gas.

19. The method of claim 1, wherein the treated SiGe surface comprises a nitride layer on the SiGe surface.

20. The method of claim 1, wherein all or a portion of the W layer is converted to a silicide during deposition of the W layer.

* * * * *